(12) United States Patent
Wu et al.

(10) Patent No.: US 10,380,964 B2
(45) Date of Patent: Aug. 13, 2019

(54) SHIFT REGISTER UNIT AND DRIVING METHOD THEREFOR

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Bo Wu, Beijing (CN); Wen Tan, Beijing (CN); Dongmei Wei, Beijing (CN); Yin Deng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/765,263

(22) PCT Filed: Sep. 8, 2017

(86) PCT No.: PCT/CN2017/101019
§ 371 (c)(1),
(2) Date: Mar. 31, 2018

(87) PCT Pub. No.: WO2018/145452
PCT Pub. Date: Aug. 16, 2018

(65) Prior Publication Data
US 2019/0066568 A1 Feb. 28, 2019

(30) Foreign Application Priority Data
Feb. 9, 2017 (CN) .......................... 2017 1 0071687

(51) Int. Cl.
*G09G 3/36* (2006.01)
*G11C 19/28* (2006.01)
(Continued)

(52) U.S. Cl.
CPC ......... *G09G 3/3677* (2013.01); *G09G 3/3266* (2013.01); *G11C 19/184* (2013.01);
(Continued)

(58) Field of Classification Search
CPC ...... G09G 3/20; G09G 3/3266; G09G 3/3674; G09G 3/3677; G09G 2300/08;
(Continued)

(56) References Cited

U.S. PATENT DOCUMENTS 7,342,568 B2 * 3/2008 Wei .................. G11C 19/28
326/97
7,436,923 B2 * 10/2008 Tobita .................. G09G 3/3677
377/64
(Continued)

FOREIGN PATENT DOCUMENTS

CN  104103244 A  10/2014
CN  104361852 A  2/2015

OTHER PUBLICATIONS

International Search Report and Written Opinion dated Dec. 5, 2017 in PCT/CN2017/101019.

*Primary Examiner* — Patrick O Neill
(74) *Attorney, Agent, or Firm* — Syncoda LLC; Feng Ma

(57) ABSTRACT

Disclosed is a shift register unit and a driving method therefor. The shift register unit includes an input circuit that is connected to a first input end and a second input end; a pull-up circuit that is connect to an output end; a first pull-down circuit and a second pull-down circuit; and where the input circuit is configured to receive a first power signal, and a second power signal, and the input circuit is controlled by the first power signal and the second power signal; the first pull-down circuit and the second pull-down circuit are connected to the input circuit and the pull-up circuit, and each first pull-down circuit is configured to receive a control signal; and the pull-up circuit is configured to receive a clock signal.

20 Claims, 16 Drawing Sheets

(51) Int. Cl.
  *G09G 3/3266* (2016.01)
  *G11C 19/18* (2006.01)
  *G09G 3/20* (2006.01)

(52) U.S. Cl.
  CPC ............... *G11C 19/28* (2013.01); *G09G 3/20* (2013.01); *G09G 2300/08* (2013.01); *G09G 2310/0267* (2013.01); *G09G 2310/0283* (2013.01); *G09G 2310/0286* (2013.01); *G09G 2310/08* (2013.01)

(58) Field of Classification Search
  CPC ... G09G 2310/0267; G09G 2310/0283; G09G 2310/0286; G11C 19/184; G11C 19/28
  See application file for complete search history.

(56) References Cited

U.S. PATENT DOCUMENTS

| | | | |
|---|---|---|---|
| 7,688,934 B2* | 3/2010 | Tsai | G11C 19/28 |
| | | | 377/64 |
| 7,817,771 B2* | 10/2010 | Tsai | G11C 19/28 |
| | | | 377/64 |
| 9,679,524 B2* | 6/2017 | Xiao | G09G 3/20 |
| 10,037,741 B2* | 7/2018 | Wang | G09G 3/36 |
| 10,217,391 B2* | 2/2019 | Shang | G11C 19/287 |
| 2014/0086379 A1* | 3/2014 | Ma | G11C 19/28 |
| | | | 377/64 |
| 2014/0119491 A1* | 5/2014 | Liu | G11C 19/28 |
| | | | 377/64 |
| 2017/0270851 A1* | 9/2017 | Shang | G11C 19/28 |
| 2018/0151148 A1* | 5/2018 | Wu | G09G 5/003 |

\* cited by examiner

SHIFT REGISTER UNIT AND DRIVING METHOD THEREFOR

CROSS-REFERENCE TO RELATED APPLICATIONS

The present application claims benefit of Chinese Patent Application No. 201710071687.1 filed on Feb. 9, 2017, the entire contents of which are incorporated by reference herein in its entirety.

TECHNICAL FIELD

The disclosure relates to display technology, and in particular to a shift register unit, and a method for driving the shift register unit.

BACKGROUND

A display device displays an image by scanning pixel units using a shift register (i.e., gate drive circuit). The shift register includes multiple cascaded shift register units, each shift register unit corresponding to a line of pixel units. The multiple cascaded shift register units achieve progressive scanning driving on each line of pixel units in the display device so as to display the image.

SUMMARY

The present disclosure discloses a shift register unit and a method for driving the shift register unit.

In a first aspect, a shift register unit is provided. The shift register unit may include an input circuit coupled to a first input end, a pull-up node and a second input end, and configured to be controlled by a first input signal receiving from the first input end and a second input signal receiving from the second input end to control a potential level at the pull-up node; and a pull-up circuit coupled to the pull-up node, a clock signal end and an output end, and configured to be controlled by a clock signal receiving from the clock signal end and the potential level at the pull-up node to generate an output signal to the output end.

The shift register unit may also include a first pull-down circuit coupled to the pull-up node, the output end and a first control signal end, and configured to be controlled by a first control signal receiving from the first control signal end to pull down the potential level at the pull-up node and a potential level at the output end; and a second pull-down circuit coupled to the pull-up node, the output end and a second control signal end, and configured to be controlled by a second control signal receiving from the second control signal end to pull down the potential level at the pull-up node and a potential level at the output end; where the first control signal is a first clock control signal and the second control signal is a second clock control signal, and the first clock control signal and the second clock control signal are provided with a time-delay.

Optionally, the first clock control signal and the second control signal have a same period, the time-delay equals to ½ of one period of each of the first clock control signal and the second clock control signal.

Optionally, a duty ratio of each of the first clock control signal and the second clock control signal is 50%.

Optionally, the first pull-down circuit may include a first control sub-circuit coupled to the pull-up node, the first control signal end and a first pull-down node, and configured to be controlled by the first control signal receiving from the first control signal end and the potential level at the pull-up node to control a potential level at the first pull-down node; and a first pull-down sub-circuit coupled to the first pull-down node, the pull-up node, a third power signal end and the output end, and configured to be controlled by the potential level at the first pull-down node to pull-down the potential level of the pull-up node and the potential level of the output end to a low voltage level.

Optionally, the first control sub-circuit may include a first transistor having a gate connected to the pull-up node, a first terminal connected to the first pull-down node, a second terminal connected to the third power signal end, and a first capacitor having one end connected to the first control signal end, and the other end connected to the first pull-down node.

Optionally, the first pull-down sub-circuit may include a second transistor having a gate connected to the first pull-down node, a first terminal connected to the pull-up node, a second terminal connected to the third power signal end; and a third transistor having a gate connected to the first pull-down node, a first terminal connected to the output end, a second terminal connected to the third power signal end.

Optionally, the second pull-down circuit may include a second control sub-circuit coupled to the pull-up node the second control signal end and a second pull-down node, and configured to be controlled by the second control signal receiving from the second control signal end and the potential level at the pull-up node to control a potential level at the second pull-down node; and a second pull-down sub-circuit coupled to the second pull-down node, the pull-up node, and the output end, and configured to be controlled by the potential level at the second pull-down node to pull-down the potential level of the pull-up node and the potential level of the output end.

Optionally, the second control sub-circuit may include a fourth transistor having a gate connected to the pull-up node, a first terminal connected to the second pull-down node, a second terminal connected to the third power signal end, and a second capacitor having one end connected to the second control signal end, and the other end connected to the second pull-down node.

Optionally, the second pull-down sub-circuit may include a fifth transistor having a gate connected to the second pull-down node, a first terminal connected to the pull-up node, a second terminal connected to the third power signal end; and a sixth transistor having a gate connected to the second pull-down node, a first terminal connected to the output end, a second terminal connected to the third power signal end.

Optionally, the input circuit may include a first power signal end to receive a first power signal, and a second power signal end to receive a second power signal.

Optionally, the input circuit may include a first input transistor having a gate connected to the first input end, a first terminal connected to the pull-up node, a second terminal connected to the first power signal end, and a second input transistor having a gate connected to the second input end, a first terminal connected to the pull-up node, a second terminal connected to the second power signal end.

Optionally, the pull-up circuit may include a pull-up transistor having a gate connected to the pull-up node, a first terminal connected to the clock signal end, a second terminal connected to the output end; a third capacitor having one end connected to the pull-up node, and the other end connected to the output end.

Optionally, the shift register unit may also include a third pull-down circuit coupled to the pull-up node, the output end and a third control signal end, and configured to be controlled by a third control signal receiving from the third control signal end to pull down the potential level at the pull-up node and the potential level at the output end.

Optionally, wherein the third control signal is a third clock control signal, the first clock control signal, the second clock control signal and the third clock control signal are provided with a first time-delay between any pair of subsequent clock signals, the first time-delay, the first clock control signal, the second clock control signal and the third clock control signal have a same period, the time-delay substantially equals to ⅓ of one period of each of the first clock control signal, the second clock control signal and the third clock control signal.

In a second aspect, a shift register unit, the shift register comprising: an input circuit coupled to a first input end, a pull-up node and a second input end, and configured to be controlled by a first input signal receiving from the first input end and a second input signal receiving from the second input end to control a potential level at the pull-up node; a pull-up circuit coupled to the pull-up node, a clock signal end and an output end, and configured to be controlled by a clock signal receiving from the clock signal end and the potential level at the pull-up node to generate an output signal to the output end; N pull-down circuits each of which coupled to one of N control signal ends, an $i^{th}$ pull-down circuit of the N pull-down circuits coupled to an $i^{th}$ control signal end of N control signal ends, the pull-up node and the output end, and the $i^{th}$ pull-down circuit is configured to be controlled by an $i^{th}$ clock control signal receiving from the ith control signal end to pull down the potential level at the pull-up node and a potential level at the output end, N being a positive integer, i being a positive integer smaller than or equal to N; the N control signal ends receives N clock control signals sequentially from a $1^{st}$ clock control signal to a N-th clock control signal respectively, the N clock control signals sequentially from a 1st clock control signal to a N-th clock control signal are provided a time delay between any pair of subsequent clock control signals.

Optionally, the time-delay equals to 1/N of one period of each clock control signals.

Optionally, the $i^{th}$ pull-down circuit comprises an $i^{th}$ control sub-circuit coupled to the pull-up node, an $i^{th}$ control signal end and an $i^{th}$ pull-down node, and configured to be controlled by an $i^{th}$ control signal receiving from the $i^{th}$ control signal end and the potential level at the pull-up node to control a potential level at the $i^{th}$ pull-down node; and an $i^{th}$ pull-down sub-circuit coupled to the $i^{th}$ pull-down node, the pull-up node, a third power signal end and the output end, and configured to be controlled by the potential level at the $i^{th}$ pull-down node to pull-down the potential level of the pull-up node and the potential level of the output end to a low voltage level.

In a third aspect, a method for driving a shift register unit is provided. The method may include receiving, by an input circuit, a first input with a high first input level of the first input from a first input end of the input circuit; receiving, by the input circuit, a first power signal with a high first power signal level of the first power signal from a first power signal end of the input circuit; driving a pull-up level to a high pull-up level at a pull-up node, wherein the pull-up node is connected to the input circuit and a pull-up circuit and is between the input circuit and the pull-up circuit; receiving, by the pull-up circuit, a clock signal with a low clock signal of the clock signal from a clock signal end of the pull-up circuit; and outputting, by the pull-up circuit, an output signal with a low output signal level of the output signal from an output end of the pull-up circuit.

The method may also include driving a second pull-down level to a low second pull-down level at a second pull-down node of a second pull-down circuit and receiving a second control signal with a high second control signal level of the second control signal from a second control signal end of the second pull-down circuit; and obtaining a first pull-down level to a low first pull-down level at a first pull-down node of a first pull-down circuit and receiving a first control signal with a low first control signal level of the first control signal from a first control signal end of the first pull-down circuit, wherein both the first pull-down circuit and the second pull-down circuit are connected to the pull-up node and the output end.

Optionally, the method may also include receiving, by the input circuit, a second input with a low second input level of the second input from a second input end of the input circuit; switching the first input to a lower first input level of the first input; switching the clock signal to a high clock signal level of the clock signal; boosting up the pull-up level to a higher pull-up level of the pull-up level; changing the output signal to a high output signal level of the output signal; changing the first control signal to a high first control signal level of the first control signal and maintain the first pull-down level to the low first pull-down level at the first pull-down node; and changing the second control signal to a low control signal level of the second control signal, and maintaining the second pull-down level at the low second pull-down level at the second pull-down node.

Optionally, the method may include switching the second input to a high second input level of the second input; receiving, by the input circuit, a second power signal with a low second power signal level of the second power signal from a second power signal end of the input circuit; switching the pull-up level to a low pull-up level of the pull-up level; maintaining the first control signal to the high first control signal level and driving the first pull-down level to a high first pull-down level of the first pull-down level; and driving down the output signal to the low output signal level.

Optionally, the method may include switching the second input to the low second input level and maintaining the first input to the low first input level; changing the second control signal to the high second control signal level, and changing the first control signal to the low first control signal level; driving up the second pull-down level to the high second pull-down level; and maintaining the output signal to the low output signal level.

Optionally, the method may include switching the first control signal to the high first control signal level; driving the first pull-down level to the high first pull-down level; and maintaining the output signal to the low output signal level.

It should be understood that both the foregoing general description and the following detailed description are only exemplary and explanatory and are not restrictive of the disclosure.

BRIEF DESCRIPTION OF DRAWINGS

In order to more clearly illustrate the technical solution in the embodiments of the disclosure, accompanying drawings needing to be used in the descriptions of the embodiments will be simply introduced hereinbelow. It is understandable that, the drawings described hereinbelow are merely some embodiments of the disclosure. Without making creative works, a person skilled in the art may also obtain other drawings according to these drawings.

Figure 1A:
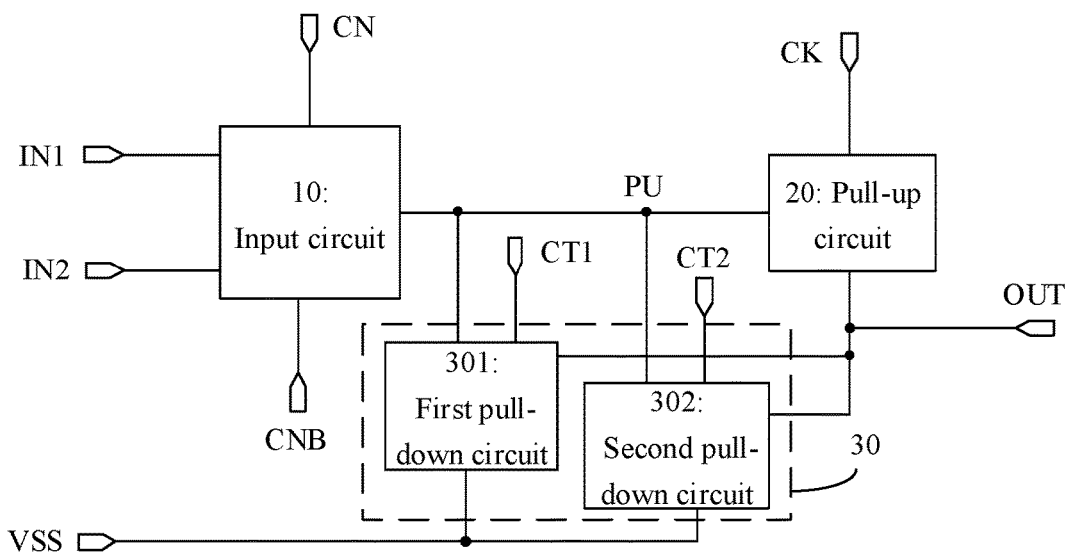
FIG. 1A is a structural diagram illustrating a shift register unit according to some embodiments of the disclosure.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

In order to make objectives, technical solutions and advantages of the disclosure clearer, the detailed description is further made hereinbelow with reference to the drawings.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

In general, there is a shift register unit which mainly includes an input circuit, an output circuit and a pull-down circuit. The input circuit may be used for inputting a voltage of an output end of a shift register unit in a previous line to the present shift register unit, and pulling a level of a pull-up node in the present shift register unit up to a high level. The output circuit may be used for outputting a drive signal to the output end under control of the pull-up node. The pull-down circuit may be used for pulling levels of the pull-up node and the output end down to a low level under control of a clock signal, so as to achieve noise reduction for the pull-up node and the output end.

However, as the pull-down circuit may be controlled by the clock signal, a transistor in the pull-down circuit cannot be effectively turned on when the clock signal is in a low level. In this case, the pull-down circuit cannot effectively pull the levels of the pull-up node and the output end down to the low level, causing poor noise reduction performance of the pull-down circuit. The present disclosure provides a shift register unit and a method of driving the shift register unit.

Transistors used in the embodiments of the disclosure may be thin film transistors or field effect transistors or other devices having the same characteristics, and the transistors used in the embodiments of the disclosure are mainly switching transistors according to their functions in a circuit. Sources and drains of the switching transistors used here are symmetric, so the sources and the drains are interchangeable. In the embodiments of the disclosure, the source is referred to as a first electrode, and the drain is referred to as a second electrode. According to the shape in the drawings, it is formulated that an intermediate end of a transistor is a gate, a signal input end is a source, and a signal output end is a drain.

In addition, the switching transistor used in the embodiments of the disclosure may include any one of a P-type switching transistor and an N-type switching transistor, where when the gate is at a low level, the P-type switching transistor is turned on, and when the gate is at a high level, the P-type switching transistor is turned off; and when the gate is at the high level, the N-type switching transistor is turned on, and when the gate is at the low level, the N-type switching transistor is turned off. In addition, multiple signals in each embodiment of the disclosure have a first level and a second level. The first level and the second level merely indicate that the levels of a certain signal have two state quantities, and do not indicate that the first level or the second level in the disclosure has a specific value.

FIG. 1 is a structural diagram illustrating a shift register unit according to some embodiments of the disclosure. As shown in FIG. 1A, the shift register unit may include an input circuit 10, a pull-up circuit 20 and N pull-down circuits 30, N being a positive integer.

The input circuit 10 is connected to each of a first input end IN1, a second input end IN2, a first power signal end CN, a second power signal end CNB and a pull-up node PU, and is used to control a level of the pull-up node PU under control of a first input signal from the first input end IN1, a second input signal from the second input end IN2, a first power signal from the first power signal end CN and a second power signal from the second power signal end CNB.

The pull-up circuit 20 is connected to each of the pull-up node PU, a clock signal end CK and an output end OUT, and is used to output a clock signal from the clock signal end CK to the output end OUT under control of the pull-up node PU.

An $i^{th}$ pull-down circuit in the N pull-down circuits 30 is connected to each of an $i^{th}$ control signal end CTi in N control signal ends, a third power signal end VSS, the pull-up node PU and the output end OUT, and the $i^{th}$ pull-down circuit is used to output a third power signal from the third power signal end VSS to the pull-up node PU and the output end OUT under control of an $i^{th}$ control signal from the $i^{th}$ control signal end CTi, i being a positive integer smaller than or equal to N.

The N control signal ends receives N clock control signals sequentially from a $1^{st}$ clock control signal to a N-th clock control signal respectively, the N clock control signals sequentially from a 1st clock control signal to a N-th clock control signal are provided a time delay between any pair of subsequent clock control signals. The time-delay equals to 1/N of one period of each clock control signals.

For example, the shift register unit as shown in FIG. 1A includes a first pull-down circuit 31 and a second pull-down circuit 32, where the first pull-down circuit 31 is connected to a first control signal end CT1, and is used to perform noise reduction on the pull-up node PU and the output end OUT under control of a first control signal from the first control signal end CT1; and the second pull-down circuit 32 is connected to a second control signal end CT2, and is used to perform noise reduction on the pull-up node PU and the output end OUT under control of a second control signal from the second control signal end CT2. The first control signal CT1 is a first clock control signal and the second control signal CT2 is a second clock control signal, and the first clock control signal and the second clock control signal are provided with a time-delay. The first clock control signal and the second control signal have a same period, the time-delay equals to ½ of one period of each of the first clock control signal and the second clock control signal. A duty ratio of each of the first clock control signal and the second clock control signal is 50%.

Figure 1B:
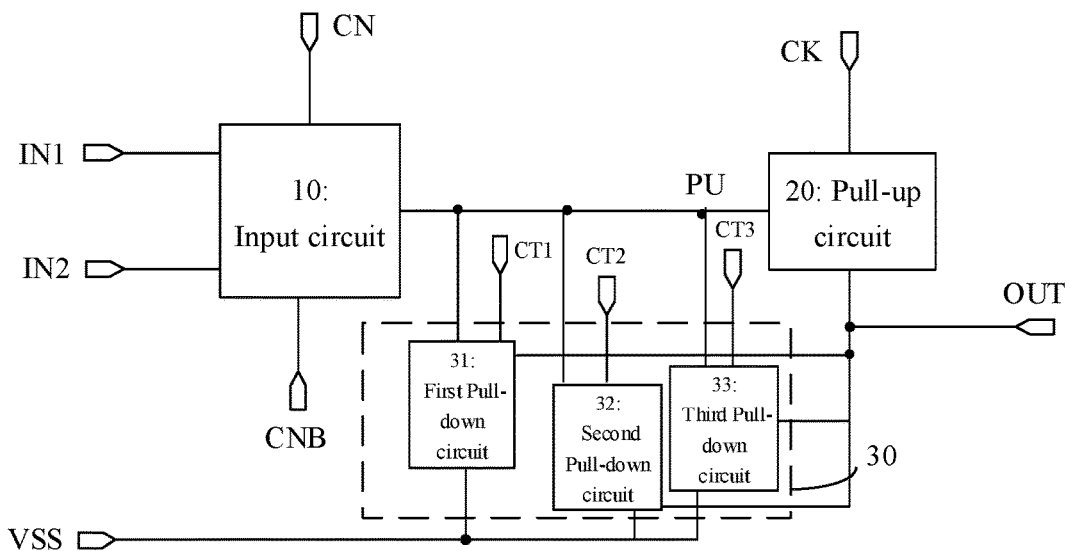
FIG. 1B shows another structural diagram illustrating a shift register unit according to some embodiments of the disclosure.

Sometimes, the shift register unit may include more than two pull-down circuits. As shown in FIG. 1B, in addition to first pull-down circuit 31 and second pull-down circuit 32, a third pull-down circuit 33 may be added. In FIG. 1B, such third pull-down circuit 33 is connected to a third control signal end CT3 and may be used to perform noise reduction on the pull-up node PU and the output end OUT under control of a third control signal from the third control signal end CT3. FIG. 1B illustrates the implementation of three pull-down circuits. However, in some implementations, it is possible to include more than three pull-down circuits.

Figure 1C:
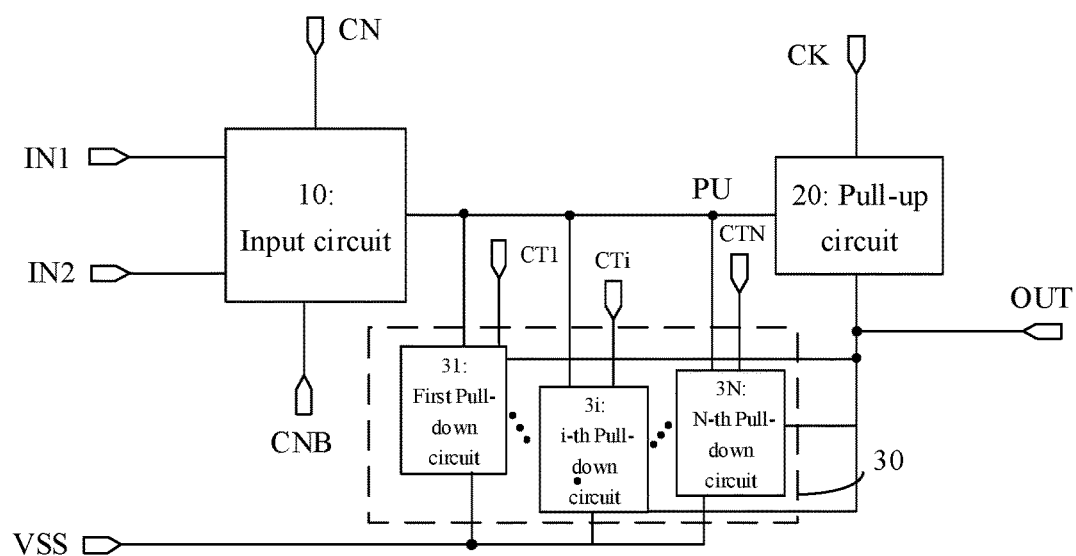
FIG. 1C shows another structural diagram illustrating a shift register unit according to some embodiments of the disclosure.

Sometimes the shift register unit may include N pull-down circuits and N control signal ends. As shown in FIG. 1C, the N pull-down circuits 30 comprises a first pull-down circuit 31 . . . an i-th pull-down circuit 3i . . . a N-th pull-down circuit 3N. The first pull-down circuit 31 is connected to the first control signal end CT1, the i-th pull-down circuit 3i is connected to the i-th control signal end CTi, the N-th pull-down circuit 3N is connected to the N-th control signal end CTN.

To sum up, the embodiment of the disclosure provides a shift register unit, which includes N pull-down circuits, each of the N pull-down circuits being controlled by a corresponding control signal end. Therefore, the N pull-down circuits can be flexibly controlled by adjusting a time sequence of control signals output by all the control signal ends, thus ensuring the noise reduction performance of the pull-down circuits. Moreover, signal ends for controlling all the circuits are independent of each other, so that it is convenient to adjust the structure of each circuit, and the use flexibility of the shift register unit is improved.

Figure 2:
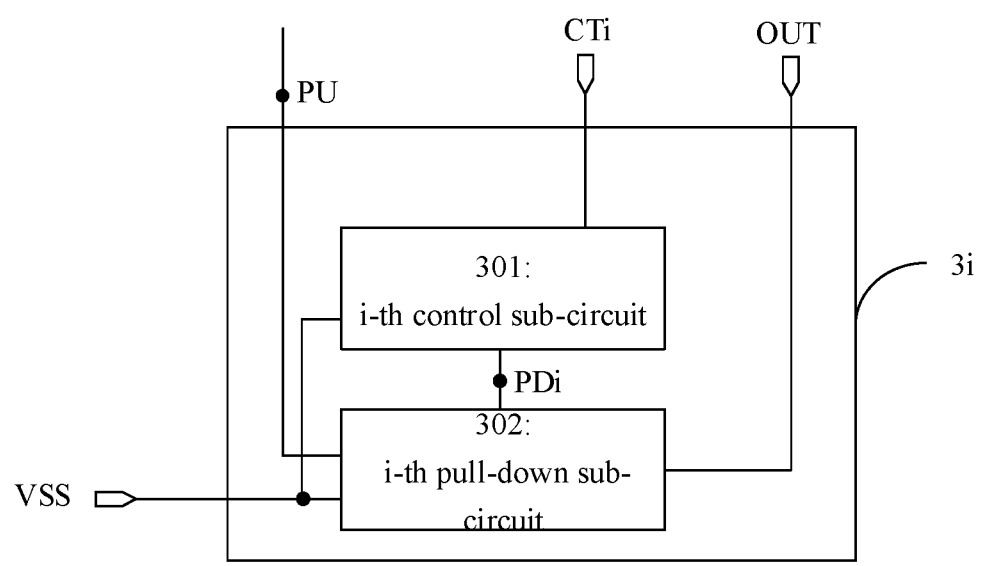
FIG. 2 is a structural diagram illustrating a pull-down circuit according to some embodiments of the disclosure.

FIG. 2 is a structural diagram illustrating a pull-down circuit according to some embodiments of the disclosure. Referring to FIG. 2, the $i^{th}$ pull-down circuit 30i may include a i-th control sub-circuit 301 and a i-th pull-down sub-circuit 302.

The i-th control sub-circuit 301 is connected to each of the $i^{th}$ control signal end CTi, the pull-up node PU, the third power signal end VSS and an $i^{th}$ pull-down node PDi, and is used to control a level of the $i^{th}$ pull-down node PDi under control of the pull-up node PU, the $i^{th}$ control signal and the third power signal.

The i-th pull-down sub-circuit 302 is connected to each of the $i^{th}$ pull-down node PDi, the third power signal end VSS, the pull-up node PU and the output end OUT, and is used to output the third power signal in the second level to the pull-up node PU and the output end OUT under control of the $i^{th}$ pull-down node PDi, so as to perform noise reduction on the pull-up node PU and the output end OUT.

Figure 3:
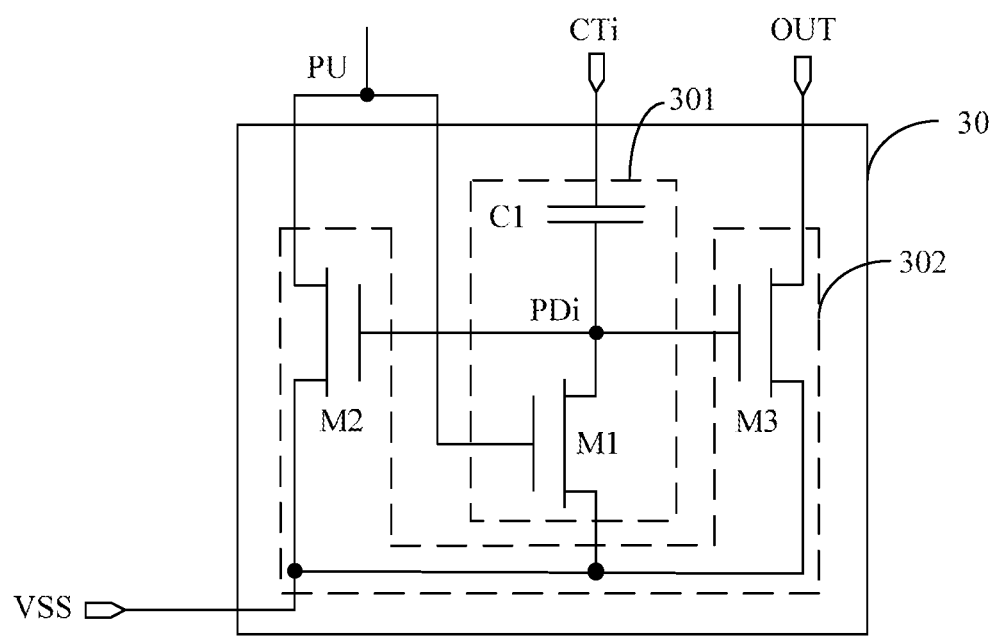
FIG. 3 is a structural diagram illustrating another pull-down circuit according to some embodiments of the disclosure.

Further, as shown in FIG. 3, the i-th control sub-circuit 301 may specifically include a first transistor M1 and a first capacitor C1.

A gate of the first transistor M1 is connected to the pull-up node PU, a first electrode is connected to the third power signal end VSS, and a second electrode is connected to the $i^{th}$ pull-down node PDi; and one end of the first capacitor C1 is connected to the $i^{th}$ control signal end CTi, and the other end is connected to the $i^{th}$ pull-down node PDi.

Optionally, referring to FIG. 3, the i-th pull-down sub-circuit 302 may specifically include a second transistor M2 and a third capacitor M3.

A gate of the second transistor M2 is connected to the $i^{th}$ pull-down node PDi, a first electrode of the second transistor M2 is connected to the third power signal end VSS, and a second electrode of the second transistor M2 is connected to the pull-up node PU; and a gate of the third transistor M3 is connected to the $i^{th}$ pull-down node PDi, a first electrode of the third transistor M3 is connected to the third power signal end VSS, and a second electrode of the third transistor M3 is connected to the output end OUT.

Figure 4:
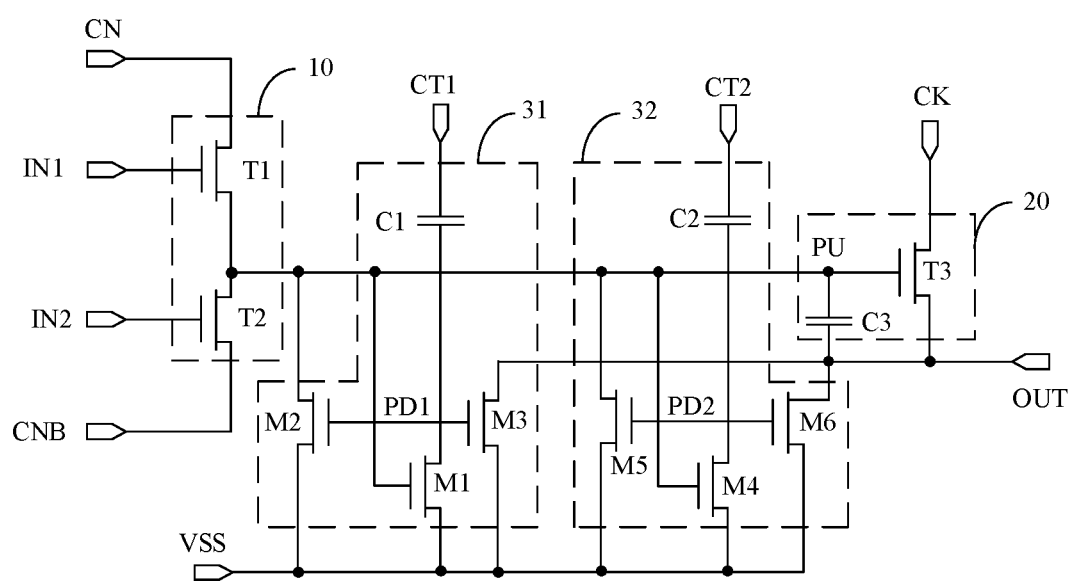
FIG. 4 is a structural diagram illustrating another shift register unit according to some embodiments of the disclosure.

FIG. 4 is a structural diagram illustrating another shift register unit according to some embodiments of the disclosure. As shown in FIG. 4, the input circuit 10 may include a first input transistor T1 and a second input transistor T2.

A gate of the first input transistor T1 is connected to the first input end IN1, a first electrode of the first input transistor T1 is connected to the first power signal end CN, and a second electrode of the first input transistor T1 is connected to the pull-up node PU; and a gate of the second input transistor T2 is connected to the second input end IN2, a first electrode of the second input transistor T2 is connected to the second power signal end CNB, and a second electrode of the second input transistor T2 is connected to the pull-up node PU.

Further, as shown in FIG. 4, the pull-up circuit 20 may include a pull-up transistor T3 and a third capacitor C3.

A gate of the pull-up transistor T3 is connected to the pull-up node PU, a first electrode of the pull-up transistor T3 is connected to the clock signal end CK, and a second electrode of the pull-up transistor T3 is connected to the output end OUT; and one end of the third capacitor C3 is connected to the pull-up node PU, and the other end of the third capacitor C3 is connected to the output end OUT.

In an optional implementation of the embodiment of the disclosure, as shown in FIG. 1 and FIG. 4, the shift register unit may include two pull-down circuits, i.e., a first first pull-down circuit 31 and a second second pull-down circuit 32.

The first first pull-down circuit 31 is connected to each of a first control signal end CT1, the third power signal end VSS, the pull-up node PU and the output end OUT. When a first control signal output by the first control signal end CT1 is in a first level, the first first pull-down circuit 31 may be in a working state and perform noise reduction on the pull-up node PU and the output end OUT.

The second second pull-down circuit 32 is connected to each of a second control signal end CT2, the third power signal end VSS, the pull-up node PU and the output end OUT. When a second control signal output by the second control signal end CT2 is in the first level, the second second pull-down circuit 32 may be in a working state and perform noise reduction on the pull-up node PU and the output end OUT.

Herein, the first control signal output by the first control signal end CT1 and the second control signal output by the second control signal end CT2 are identical in frequency and opposite in phase. Therefore, the two pull-down circuits are enabled to work alternately under control of the two control signals, thus avoiding a phenomenon of shifting of a threshold voltage Vth due to long-time turn-on of a transistor inside a pull-down circuit caused by long-time working of this pull-down circuit, so as to ensure the reliability of each pull-down circuit.

To sum up, the embodiment of the disclosure provides a shift register unit, which includes N pull-down circuits, each pull-down circuit in the N pull-down circuits being controlled by a corresponding control signal end. Therefore, the N pull-down circuits can be flexibly controlled by adjusting a time sequence of control signals output by all the control signal ends, thus ensuring the noise reduction performance of the pull-down circuits. Moreover, the N pull-down circuits can work alternately, so that the turn-on time of a transistor in each pull-down circuit can be shortened, and the reliability of the pull-down circuits is improved. Furthermore, signal ends for controlling all the circuits are independent of each other, for example, an $i^{th}$ control signal end controls an $i^{th}$ pull-down circuit, a clock signal end controls a pull-up circuit, a first power signal end CN and a second power signal end CNB control an input circuit, and the time sequence of all the signal ends can be independently adjusted, so that it is convenient to adjust the structure of each circuit, there is little restrictions for the shift register unit in circuit application, and the use flexibility of the shift register unit is improved.

Figure 5:
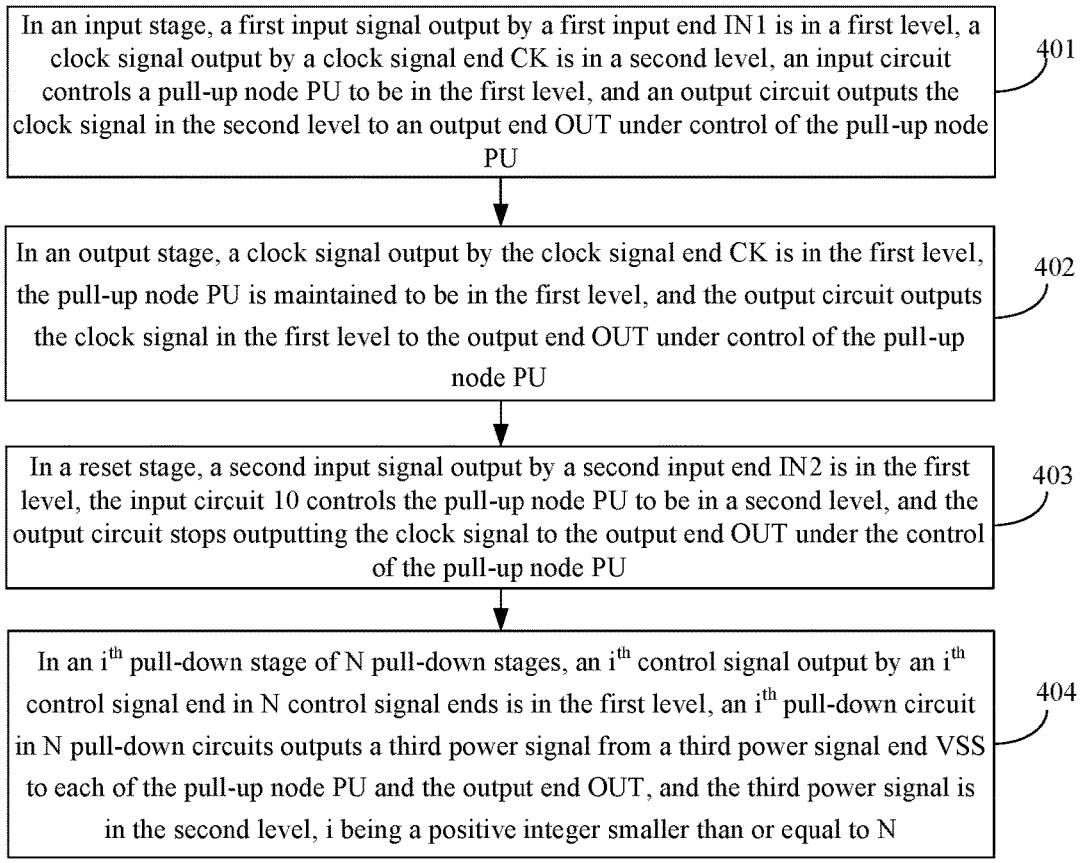
FIG. 5 is a flowchart showing a method for driving a shift register unit according to some embodiments of the disclosure.

FIG. 5 is a flowchart showing a method for driving a shift register unit according to some embodiments of the disclosure. Referring to FIG. 1 and FIG. 4, the shift register unit may include an input circuit 10, a pull-up circuit 20 and N pull-down circuits 30, N being a positive integer. The driving method may include an input stage, an output stage, a reset stage and N pull-down stages. Specifically, as shown in FIG. 5, the method may include the steps as follows.

In Step 401, in the input stage, a first input signal output by a first input end IN1 is in the first level, a clock signal output by a clock signal end CK is in the second level, the input circuit controls a pull-up node PU to be in the first level, and the output circuit outputs the clock signal in the second level to an output end OUT under control of the pull-up node PU.

In Step 402, in the output stage, a clock signal output by the clock signal end CK is in the first level, the pull-up node PU is maintained to be in the first level, and the output circuit outputs the clock signal in the first level to the output end OUT under control of the pull-up node PU.

In Step 403, in the reset stage, a second input signal output by a second input end IN2 is in the first level, the input circuit 10 controls the pull-up node PU to be in the second level, and the output circuit stops outputting the clock signal to the output end OUT under control of the pull-up node PU.

In Step 404, in an $i^{th}$ pull-down stage of the N pull-down stages, an $i^{th}$ control signal output by an $i^{th}$ control signal end of N control signal ends is in the first level, an $i^{th}$ pull-down circuit of the N pull-down circuits outputs a third power signal from a third power signal end VSS to the pull-up node PU and the output end OUT, and the third power signal is in the second level, i being a positive integer smaller than or equal to N.

To sum up, the embodiment of the disclosure provides a method for driving a shift register unit. The driving method includes N pull-down stages. In each of the N pull-down stages, a corresponding pull-down circuit can be controlled by a control signal end, so as to perform noise reduction on a pull-up node and an output end. Therefore, the driving method according to the embodiment of the disclosure can achieve cyclic noise reduction on the pull-up node and the output end by controlling a time sequence of all the control signal ends, thus effectively improving the noise reduction performance of the shift register unit.

Optionally, as shown in FIG. 2, the $i^{th}$ pull-down circuit in the shift register unit may include a i-th control sub-circuit 301 and a i-th pull-down sub-circuit 302.

Correspondingly, in the $i^{th}$ pull-down stage as shown in Step 404, the $i^{th}$ control signal is in the first level, the i-th control sub-circuit 301 in the $i^{th}$ pull-down circuit may control an $i^{th}$ pull-down node PDi to be in the first level under control of the $i^{th}$ control signal, and the i-th pull-down sub-circuit 302 in the $i^{th}$ pull-down circuit may output the third power signal to the pull-up node PU and the output end OUT under control of the $i^{th}$ pull-down node PDi.

Referring to FIG. 3, the i-th control sub-circuit 301 may specifically include a first transistor M1 and a first capacitor C1, and the i-th pull-down sub-circuit 302 may specifically include a second transistor M2 and a third capacitor M3.

Therefore, in the $i^{th}$ pull-down stage, the $i^{th}$ control signal is in the first level, the first capacitor C1 in the $i^{th}$ pull-down circuit may control the $i^{th}$ pull-down node PDi to be in the first level, the second transistor M2 and the third transistor M3 are turned on, and the third power signal end VSS outputs the third power signal to the pull-up node PU through the second transistor M2 and outputs the third power signal to the output end OUT through the third transistor M3. Thus, noise reduction on the pull-up node PU and the output end OUT in the shift register unit can be achieved.

Figure 6:
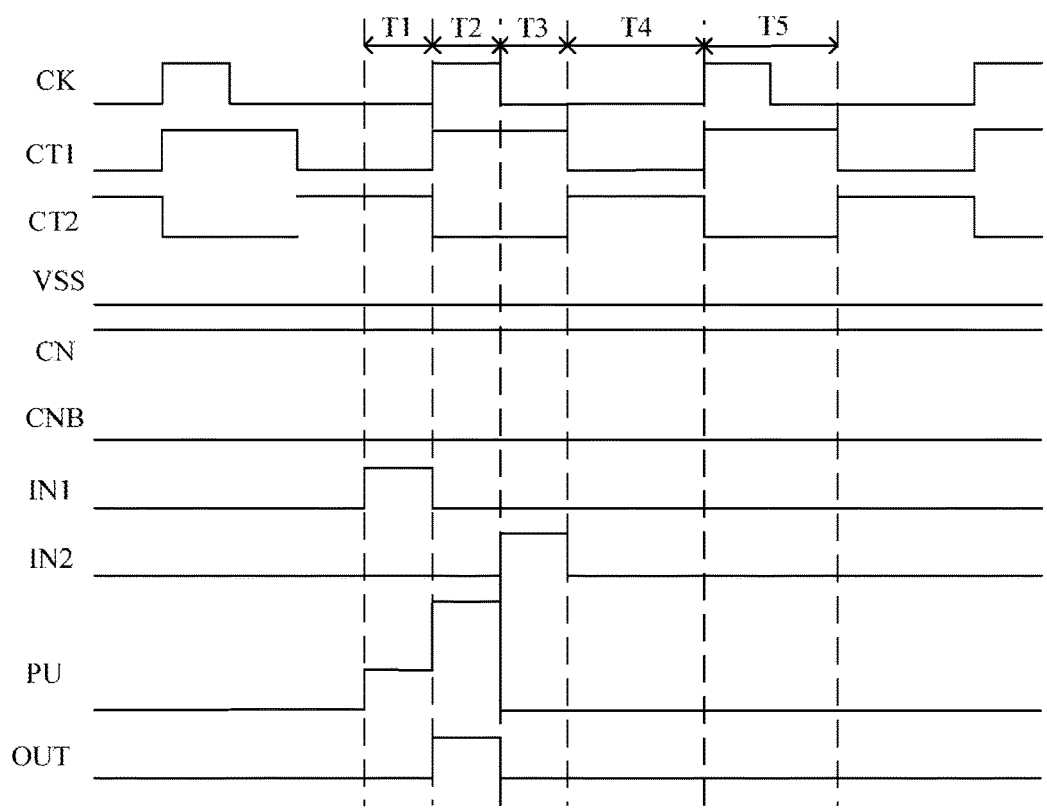
FIG. 6 is a timing diagram showing a process of driving a shift register unit according to some embodiments of the disclosure.

Further, the method for driving the shift register unit as shown in FIG. 4, according to the embodiment of the disclosure, will be explained in detail. FIG. 6 is a timing diagram showing a process of driving a shift register unit according to some embodiments of the disclosure.

As shown in FIG. 6, in an input stage T1, a first input signal output by a first input end IN1 is in the first level, a first input transistor T1 in the input circuit 10 is turned on, and the first input end IN1 outputs the first input signal in the first level to a pull-up node PU. At this time, a pull-up transistor T3 in the pull-up circuit 20 is turned on, and a clock signal end CK outputs a clock signal in the second level to an output end OUT.

Meanwhile, because the pull-up node PU is in the first level, a first transistor M1 in the first first pull-down circuit 31 and a fourth transistor M4 in the second second pull-down circuit 32 are turned on. At this time, for the first first pull-down circuit 31, as a first control signal output by the first control signal end CT1 is in the second level, a first pull-down node PD1 is in the second level, and a second transistor M2 and a third transistor M3 in the first first pull-down circuit 31 are turned off under control of the first capacitor C1 and the third power signal; and for the second second pull-down circuit 32, although a second control signal output by the second control signal end CT2 is in the first level, as the third power signal end VSS may output the third power signal in the second level to a second pull-down node PD2 through the fourth transistor M4, the second pull-down node PD2 is in the second level, and a fifth transistor M5 and a sixth transistor M6 in the second second pull-down circuit 32 are also in a turn-off state.

In an output stage T2, signals output by both the first input end IN1 and the second input end IN2 are in the second level, and a first input transistor T1 and a second input transistor T2 are turned off; a clock signal output by the clock signal end CK is in the first level, the level of the pull-up node PU is further pulled up due to a bootstrap effect; and at this time, a pull-up transistor T3 is maintained in a turn-on state, and the clock signal end CK may output a clock signal in the first level to the output end OUT so as to drive a pixel unit in the display device.

Meanwhile, a first control signal output by the first control signal end CT1 is in the first level, the first transistor M1 in the first first pull-down circuit 31 is turned on under control of the pull-up node PU, the first pull-down node PD1 is controlled to be in the second level, and the second transistor M2 and the third transistor M3 in the first first pull-down circuit 31 are turned off; and a second control signal output by the second control signal end CT2 is in the second level, the fourth transistor M4 in the second second pull-down circuit 32 is turned on under control of the pull-up node PU, the second pull-down node PD2 is controlled to be in the second level, and the fifth transistor M5 and the sixth transistor M6 in the second second pull-down circuit 32 are also in a turn-off state.

In a reset stage T3, a second input signal output by the second input end IN2 is in the first level, a second power signal output by the second power signal end CNB is in the second level, the second input transistor T2 is turned on, and outputs the second power signal to the pull-up node PU. At this time, the pull-up node PU is reset, the pull-up transistor T3 is turned off, and the output circuit stops outputting a clock signal to the output end OUT, and thus the output end is in the second level at this time.

Meanwhile, the first control signal output by the first control signal end CT1 is in the first level, the pull-up node PU is in the second level, and the first transistor M1 in the first first pull-down circuit 31 is turned off, so that under the first capacitor C1, the level of the first pull-down node PD1 is pulled up to the first level. At this time, the second transistor M2 and the third transistor M3 in the first first pull-down circuit 31 are turned on to perform noise reduction on the pull-up node PU and the output end OUT. That is, in the reset stage T3, the first first pull-down circuit 31 is also in a working state, namely the first pull-down stage and the reset stage T3 can be executed simultaneously.

In a second pull-down stage T4, both signals output by the first input end IN1 and the second input end IN2 are in the second level, and the first input transistor T1 and the second input transistor T2 are turned off; a second control signal output by the second control signal end CT2 is in the first level, a second capacitor C2 in the second second pull-down circuit 32 controls the second pull-down node PD2 to be in the first level, and the fifth transistor M5 and the sixth transistor M6 in the second second pull-down circuit 32 are turned on to perform noise reduction on the pull-up node PU and the output end OUT.

Further, as shown in FIG. 6, after the second pull-down stage T4, the first control signal end CT1 outputs the first control signal in the first level, the shift register unit may execute the first pull-down stage T5 again, and the first first pull-down circuit 31 performs noise reduction on the pull-up node PU and the output end OUT. Then, the shift register unit may repeat the second pull-down stage T4 and the first pull-down stage T5, in order to cyclically perform noise reduction on the pull-up node PU and the output end OUT until the first input signal output by the first input end IN1 is in the first level.

As can be seen from FIG. 6, the control signals output by the two control signal ends CT1 and CT2 are identical in frequency and opposite in phase, so that the first pull-down circuit 31 and the second pull-down circuit 32 can work alternately. Moreover, the frequencies and phases of the control signals output by the two control signal ends CT1 and CT2 are unrelated to those of the clock signal output by the clock signal end CK in the shift register unit, thus ensuring that each pull-down circuit can be independently controlled, and improving the use flexibility of the shift register unit.

Figure 7:
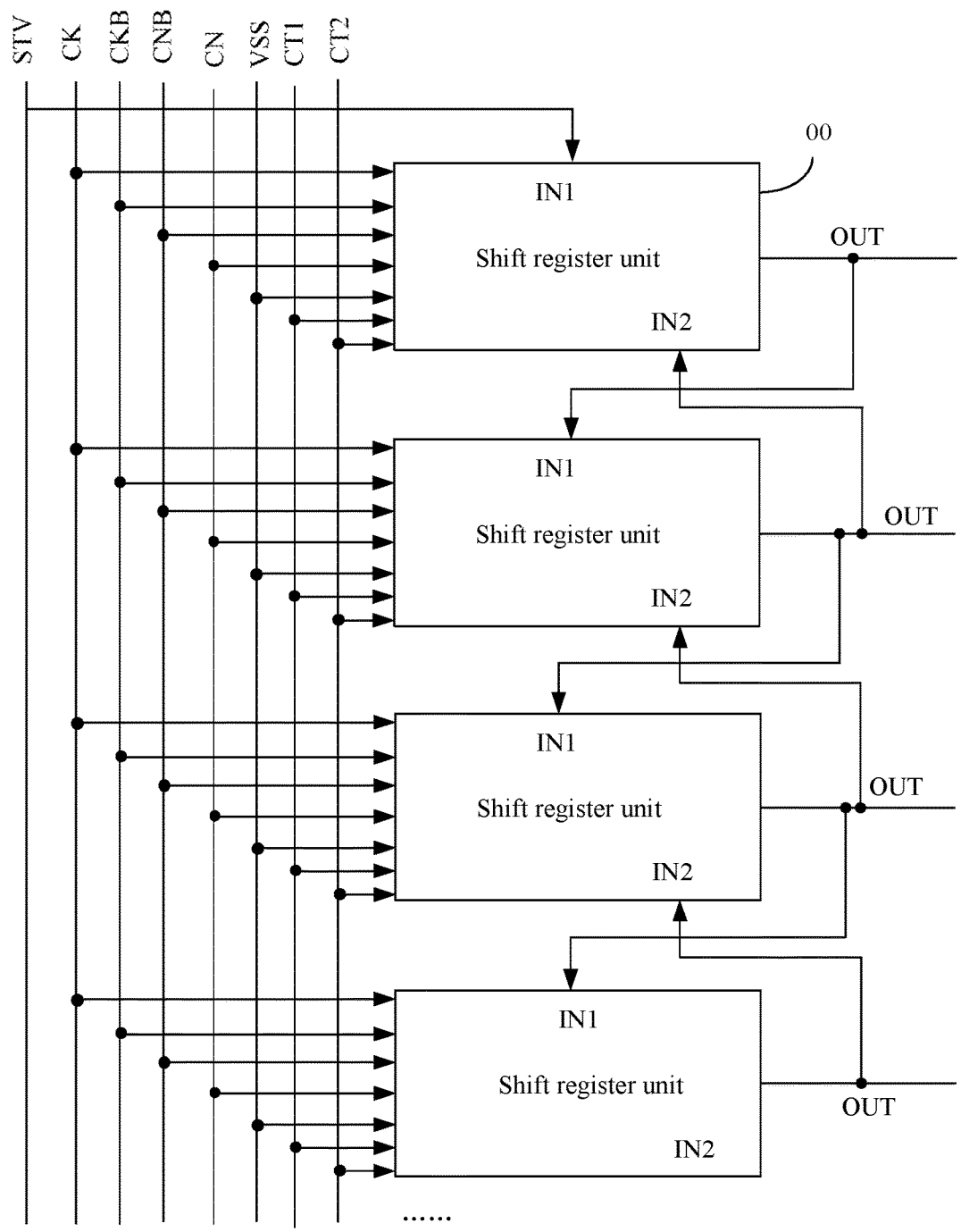
FIG. 7 is a structural diagram illustrating a gate drive circuit according to some embodiments of the disclosure.

Some embodiments of the disclosure provides a gate drive circuit. Referring to FIG. 7, the gate drive circuit may include at least two cascaded shift register units 00, where each shift register unit 00 may be the shift register unit as shown in FIG. 1 or FIG. 4.

As can be seen from FIG. 7, a first input end IN1 in each shift register unit may be connected to an output end OUT of a previous-stage shift register unit, a second input end IN2 in each shift register unit may be connected to an output end OUT of a subsequent-stage shift register unit, and a first input end IN1 of a first-stage shift register unit in the gate drive circuit is connected to a frame starting signal end STV. By controlling the first input end IN1, the second input end IN2, a first power signal end CN and a second power signal end CNB, each shift register unit in the gate drive circuit is enabled to scan a display device forwardly and reversely.

For example, when the first input end IN1 (i.e., frame starting signal end STV) of the first-stage shift register unit is controlled to output a signal in the first level, the first power signal end CN is controlled to output a first power signal in the first level, and the second power signal end CNB is controlled to output a second power signal in the second level, all the shift register units in the gate drive circuit can be sequentially started from the first-stage shift register unit, and therefore the display device can be scanned forwardly. When the first input end IN1 of a last-stage shift register unit is controlled to output a signal in the first level, the first power signal end CN is controlled to output a first power signal in the second level, and the second power signal end CNB is controlled to output a second power signal in the first level, all the shift register units in the gate drive circuit can be sequentially started from the last-stage shift register unit, and therefore the display device can be scanned reversely.

Figure 8A:
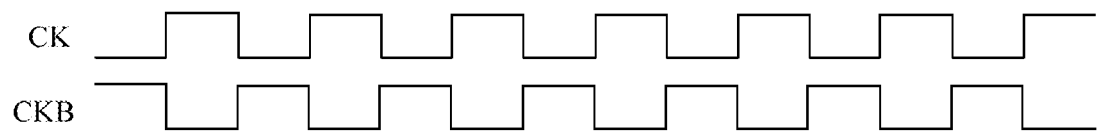
FIG. 8A is a waveform diagram of each clock signal according to some embodiments of the disclosure.

In some embodiments of the disclosure, referring to FIG. 7, the gate drive circuit may include two clock signal ends CK and CKB (also referred to as a two-phase clock), waveforms of clock signals output by the two clock signal ends CK and CKB may be as shown in FIG. 8A, namely the two clock signals are identical in frequency and opposite in phase.

Figure 8B:
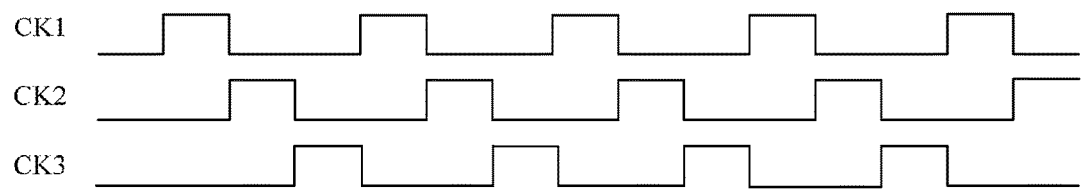
FIG. 8B is another waveform diagram of each clock signal according to some embodiments of the disclosure.
Figure 8C:
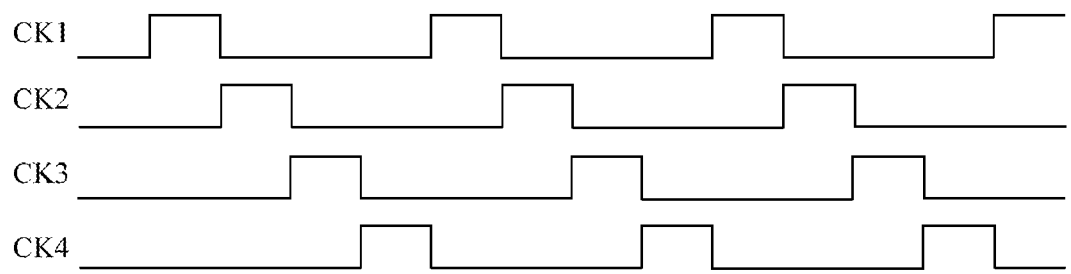
FIG. 8C is a further waveform diagram of each clock signal according to some embodiments of the disclosure.

Moreover, in some embodiments of the disclosure, the gate drive circuit may further use a three-phase clock (i.e., three clock signal ends) or a four-phase clock (i.e., four clock signal ends) or a multi-phase clock. When the three-phase clock is used, waveforms of three clock signal ends CK1, CK2 and CK3 in the gate drive circuit may be as shown in FIG. 8B. When the four-phase clock is used, waveforms of four clock signal ends CK1, CK2, CK3 and CK4 in the gate drive circuit may be as shown in FIG. 8C.

Optionally, in some embodiments of the disclosure, the frequency, pulse width (i.e., duration of the first level within each period) and period of a control signal output by each control signal end in N control signal ends can be adjusted according to situations, and the frequency, pulse width and period of each control signal are unrelated to the clock signals. For example, the pulse width of each control signal may be n times of the pulse width of any clock signal, where n is a number greater than 0. For example, if two control signal ends CT1 and CT2 are disposed in the gate drive circuit, referring to FIG. 9A, the pulse width of the control signal output by each control signal end may be equal to the pulse width of the clock signal, or as shown in FIG. 9B, the pulse width of the control signal output by each control signal end may be two times the pulse width of the clock signal Moreover, the duty ratio of each control signal is not limited to be 50%, that is, the duty ratio of each control signal can be adjusted according to situations. For example, as shown in FIG. 9C, the duty ratios of control signals output by the first control signal end CT1 and the second control signal end CT2 are different from each other, and neither of them is 50%.

Figure 9A:
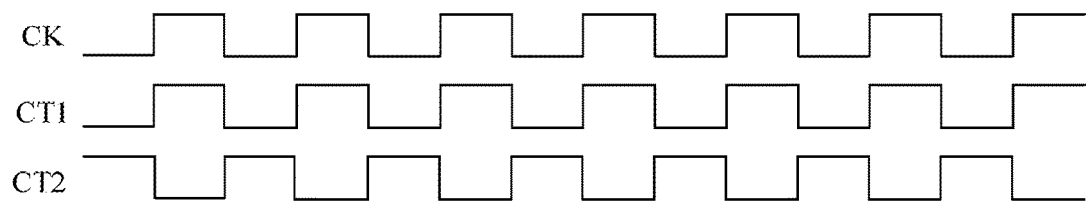
FIG. 9A is a waveform diagram of each control signal according to some embodiments of the disclosure.
Figure 9B:
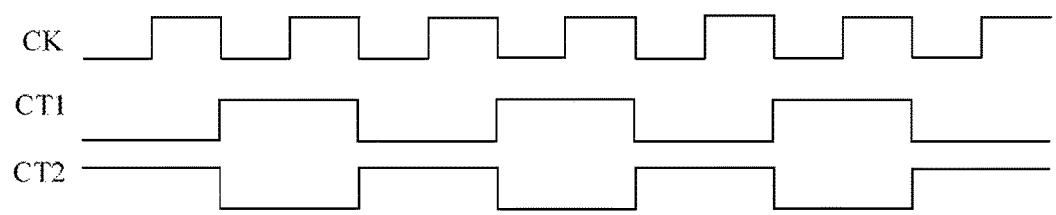
FIG. 9B is another waveform diagram of each control signal according to some embodiments of the disclosure.
Figure 9C:
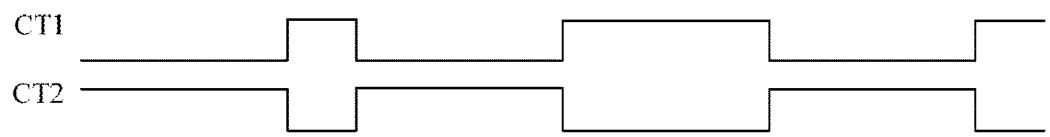
FIG. 9C is a further waveform diagram of each control signal according to some embodiments of the disclosure.

It is to be noted that in order to shorten the turn-on time of the transistor in each pull-down circuit, referring to FIG. 9A to FIG. 9C, the waveforms of the control signals output by the two control signal ends are complementary, that is, the two control signals are identical in frequency and opposite in phase. At this time, two pull-down circuits in each shift register unit may work alternately, so that on the premise of ensuring the noise reduction performance, the working time of each pull-down circuit can be shortened to the greatest extent.

Figure 9D:
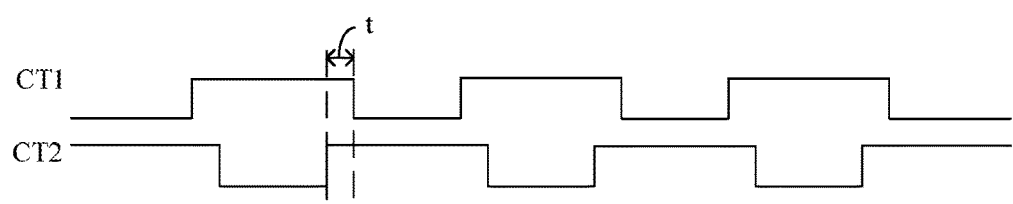
FIG. 9D is a yet further waveform diagram of each control signal according to some embodiments of the disclosure.

Of course, referring to FIG. 9D, the pulse widths of the control signals output by the two control signal ends may be overlapped. For example, an overlap stage t exists in a waveform diagram shown in FIG. 9D. In the overlap stage t, both the two control signals are in the first level, and at this time, two pull-down circuits in each shift register unit are in the working state. That is, in the process of driving the shift register unit, two adjacent pull-down stages in N pull-down stages may be partially overlapped.

It is to be noted that when a time sequence of control signals output by N control signal ends is adjusted, it is necessary to ensure that N control signals output by the N control signal ends cannot be in the second level simultaneously, thus avoiding noises of the pull-up node PU and the output end OUT caused by the fact that no pull-down circuit performs noise reduction on the pull-up node PU and the output end OUT.

It is also to be noted that the above-mentioned embodiment is illustrated with an example that each transistor is an N-type transistor and the first level is a high level as compared to the second level. Of course, each transistor may be a P-type transistor. When each transistor is the P-type transistor, the first level may be a low level as compared to the second level, and the level change of each signal end may be opposite to the level change as shown in FIG. 6. A phase difference therebetween may be 180 degrees.

Some embodiments of the disclosure provides a display device. The display device may include the gate drive circuit as shown in FIG. 7. The display device may be: any products or components having a display function such as a liquid crystal panel, electronic paper, an Organic Light Emitting Diode (OLED) panel, an Active Matrix Organic Light Emitting Diode (AMOLED) panel, a mobile phone, a tablet computer, a television set, a display, a laptop, a digital photo frame and a navigator.

Figure 10:
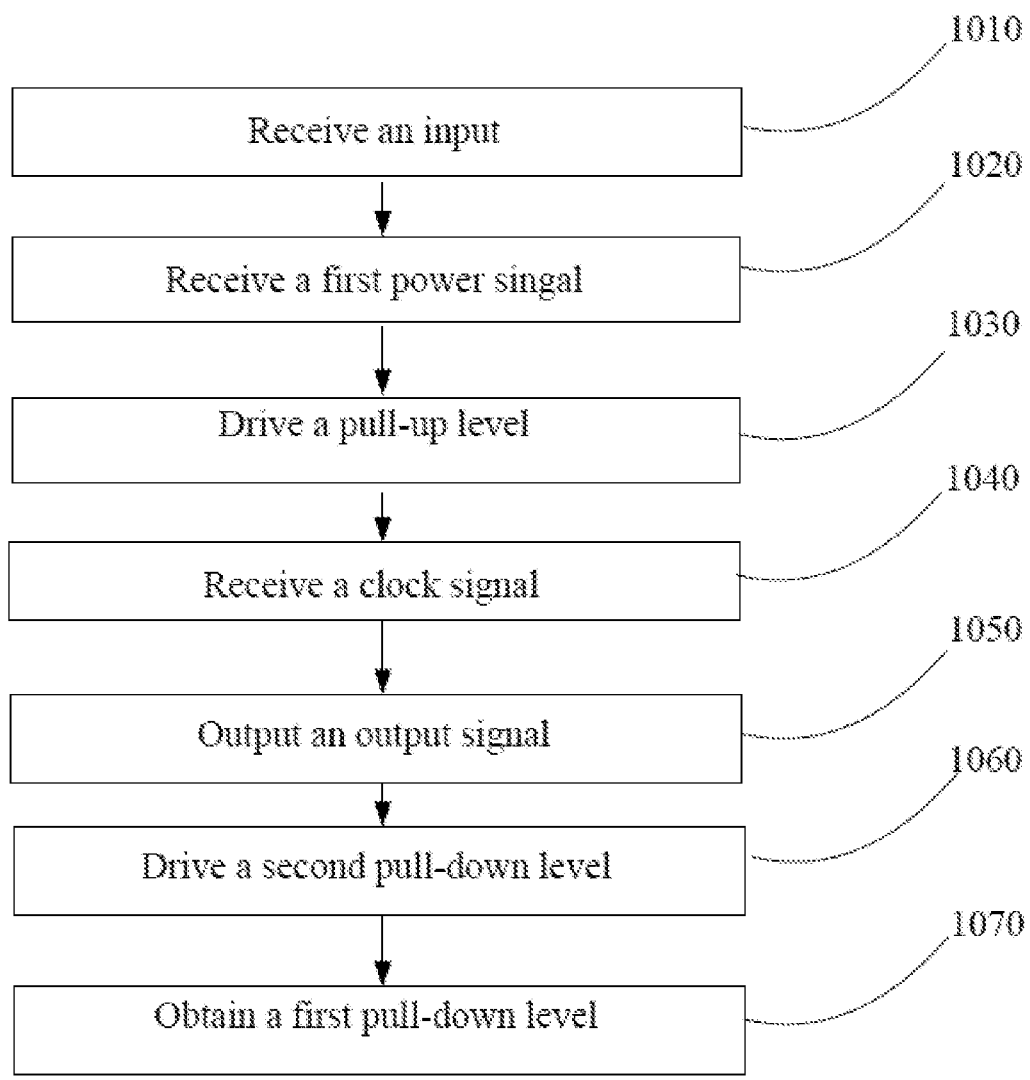
FIG. 10 shows an example of the processing diagram of a method for driving a shift register unit.

FIG. 10 shows an example of the processing diagram of a method for driving a shift register unit. As shown in FIG. 10, a method for driving a shift register unit may include: receiving, by an input circuit, a first input with a high first input level of the first input from a first input end of the input circuit 1010; receiving, by the input circuit, a first power signal with a high first power signal level of the first power signal from a first power signal end of the input circuit 1020; driving a pull-up level to a high pull-up level at a pull-up node, where the pull-up node is connected to the input circuit and a pull-up circuit and is between the input circuit and the pull-up circuit 1030; receiving, by the pull-up circuit, a clock signal with a low clock signal of the clock signal from a clock signal end of the pull-up circuit 1040; and outputting, by the pull-up circuit, an output signal with a low output signal level of the output signal from an output end of the pull-up circuit 1050.

The method may also include driving a second pull-down level to a low second pull-down level at a second pull-down node of a second pull-down circuit and receiving a second control signal with a high second control signal level of the second control signal from a second control signal end of the second pull-down circuit 1060; and obtaining a first pull-down level to a low first pull-down level at a first pull-down node of a first pull-down circuit and receiving a first control signal with a low first control signal level of the first control signal from a first control signal end of the first pull-down circuit, where both the first pull-down circuit and the second pull-down circuit are connected to the pull-up node and the output end 1070.

Optionally, the method may further include receiving, by the input circuit, a second input with a low second input level of the second input from a second input end of the input circuit; switching the first input to a lower first input level of the first input; switching the clock signal to a high clock signal level of the clock signal; boosting up the pull-up level to a higher pull-up level of the pull-up level; changing the output signal to a high output signal level of the output signal; changing the first control signal to a high first control signal level of the first control signal and maintain the first pull-down level to the low first pull-down level at the first pull-down node; and changing the second control signal to a low control signal level of the second control signal, and maintaining the second pull-down level at the low second pull-down level at the second pull-down node.

Optionally, the method may further include switching the second input to a high second input level of the second input; receiving, by the input circuit, a second power signal with a low second power signal level of the second power signal from a second power signal end of the input circuit; switching the pull-up level to a low pull-up level of the pull-up level; maintaining the first control signal to the high first control signal level and driving the first pull-down level to a high first pull-down level of the first pull-down level; and driving down the output signal to the low output signal level.

Optionally, the method may further include switching the second input to the low second input level and maintaining the first input to the low first input level; changing the second control signal to the high second control signal level, and changing the first control signal to the low first control signal level; driving up the second pull-down level to the high second pull-down level; and maintaining the output signal to the low output signal level.

Optionally, the method may further include switching the first control signal to the high first control signal level; driving the first pull-down level to the high first pull-down level; and maintaining the output signal to the low output signal level.

A person skilled in the art can clearly understand that the above-mentioned specific working process of the gate drive circuit, the shift register unit and each circuit may refer to a corresponding process in the method embodiment for convenience and conciseness of description and will not be elaborated herein.

The above is only the preferred embodiments of the disclosure, and not intended to limit the disclosure. Any modifications, equivalent replacements, improvements and the like made within the spirit and principle of the disclosure shall fall within the scope of protection of the disclosure.

The invention claimed is:

1. A shift register unit, comprising:
    an input circuit coupled to a first input end, a pull-up node and a second input end, and configured to be controlled by a first input signal receiving from the first input end and a second input signal receiving from the second input end to control a potential level at the pull-up node;
    a pull-up circuit coupled to the pull-up node, a clock signal end and an output end, and configured to be controlled by a clock signal receiving from the clock signal end and the potential level at the pull-up node to generate an output signal to the output end;
    a first pull-down circuit coupled to the pull-up node, the output end and a first control signal end, and configured to be controlled by a first control signal receiving from the first control signal end to pull down the potential level at the pull-up node and a potential level at the output end;
    a second pull-down circuit coupled to the pull-up node, the output end and a second control signal end, and configured to be controlled by a second control signal receiving from the second control signal end to pull down the potential level at the pull-up node and a potential level at the output end; and
    wherein the first control signal is a first clock control signal and the second control signal is a second clock control signal, and the first clock control signal and the second clock control signal are provided with a time-delay.

2. The shift register unit of claim 1, wherein the first clock control signal and the second control signal have a same period, the time-delay equals to ½ of one period of each of the first clock control signal and the second clock control signal.

3. The shift register unit of claim 2, wherein a duty ratio of each of the first clock control signal and the second clock control signal is 50%.

4. The shift register unit of claim 1, wherein the first pull-down circuit comprises
    a first control sub-circuit coupled to the pull-up node, the first control signal end and a first pull-down node, and configured to be controlled by the first control signal receiving from the first control signal end and the potential level at the pull-up node to control a potential level at the first pull-down node; and
    a first pull-down sub-circuit coupled to the first pull-down node, the pull-up node, a third power signal end and the output end, and configured to be controlled by the potential level at the first pull-down node to pull-down the potential level of the pull-up node and the potential level of the output end to a low voltage level.

5. The shift register unit of claim 4, wherein the first control sub-circuit comprises
    a first transistor having a gate connected to the pull-up node, a first terminal connected to the first pull-down node, a second terminal connected to the third power signal end, and
    a first capacitor having one end connected to the first control signal end, and the other end connected to the first pull-down node.

6. The shift register unit of claim 4, wherein the first pull-down sub-circuit comprises
    a second transistor having a gate connected to the first pull-down node, a first terminal connected to the pull-up node, a second terminal connected to the third power signal end; and
    a third transistor having a gate connected to the first pull-down node, a first terminal connected to the output end, a second terminal connected to the third power signal end.

7. The shift register unit of claim 1, wherein the second pull-down circuit comprises
    a second control sub-circuit coupled to the pull-up node, the second control signal end and a second pull-down node, and configured to be controlled by the second control signal receiving from the second control signal end and the potential level at the pull-up node to control a potential level at the second pull-down node; and a second pull-down sub-circuit coupled to the second pull-down node, the pull-up node, and the output end, and configured to be controlled by the potential level at the second pull-down node to pull-down the potential level of the pull-up node and the potential level of the output end.

8. The shift register unit of claim 7, wherein the second control sub-circuit comprises
a fourth transistor having a gate connected to the pull-up node, a first terminal connected to the second pull-down node, a second terminal connected to the third power signal end, and
a second capacitor having one end connected to the second control signal end, and the other end connected to the second pull-down node.

9. The shift register unit of claim 7, wherein the second pull-down sub-circuit comprises
a fifth transistor having a gate connected to the second pull-down node, a first terminal connected to the pull-up node, a second terminal connected to the third power signal end; and
a sixth transistor having a gate connected to the second pull-down node, a first terminal connected to the output end, a second terminal connected to the third power signal end.

10. The shift register unit of claim 1, wherein the input circuit further comprises a first power signal end to receive a first power signal, and a second power signal end to receive a second power signal.

11. The shift register unit of claim 10, wherein the input circuit comprises:
a first input transistor having a gate connected to the first input end, a first terminal connected to the pull-up node, a second terminal connected to the first power signal end; and
a second input transistor having a gate connected to the second input end, a first terminal connected to the pull-up node, a second terminal connected to the second power signal end.

12. The shift register unit of claim 1, wherein the pull-up circuit comprises:
a pull-up transistor having a gate connected to the pull-up node, a first terminal connected to the clock signal end, a second terminal connected to the output end; and
a third capacitor having one end connected to the pull-up node, and the other end connected to the output end.

13. The shift register unit of claim 1, further comprising a third pull-down circuit coupled to the pull-up node, the output end and a third control signal end, and configured to be controlled by a third control signal receiving from the third control signal end to pull down the potential level at the pull-up node and the potential level at the output end.

14. The shift register unit of claim 13, wherein the third control signal is a third clock control signal,
the first clock control signal, the second clock control signal and the third clock control signal are provided with a first time-delay between any pair of subsequent clock signals, the first time-delay, and
the first clock control signal, the second clock control signal and the third clock control signal have a same period, the time-delay substantially equals to ⅓ of one period of each of the first clock control signal, the second clock control signal and the third clock control signal.

15. A shift register unit, comprising:
an input circuit coupled to a first input end, a pull-up node and a second input end, and configured to be controlled by a first input signal receiving from the first input end and a second input signal receiving from the second input end to control a potential level at the pull-up node;
a pull-up circuit coupled to the pull-up node, a clock signal end and an output end, and configured to be controlled by a clock signal receiving from the clock signal end and the potential level at the pull-up node to generate an output signal to the output end;
N pull-down circuits each of which coupled to one of N control signal ends, an $i^{th}$ pull-down circuit of the N pull-down circuits coupled to an $i^{th}$ control signal end of N control signal ends, the pull-up node and the output end, and the $i^{th}$ pull-down circuit is configured to be controlled by an $i^{th}$ clock control signal receiving from the $i^{th}$ control signal end to pull down the potential level at the pull-up node and a potential level at the output end, N being a positive integer, i being a positive integer smaller than or equal to N, and
wherein the N control signal ends receives N clock control signals sequentially from a $1^{st}$ clock control signal to a N-th clock control signal respectively, the N clock control signals sequentially from a 1st clock control signal to a N-th clock control signal are provided a time delay between any pair of subsequent clock control signals.

16. The shift register according to claim 15, wherein the time-delay equals to 1/N of one period of each clock control signals.

17. The shift register according to claim 15, wherein the $i^{th}$ pull-down circuit comprises
an $i^{th}$ control sub-circuit coupled to the pull-up node, an $i^{th}$ control signal end and an $i^{th}$ pull-down node, and configured to be controlled by an $i^{th}$ control signal receiving from the $i^{th}$ control signal end and the potential level at the pull-up node to control a potential level at the $i^{th}$ pull-down node; and
an $i^{th}$ pull-down sub-circuit coupled to the $i^{th}$ pull-down node, the pull-up node, a third power signal end and the output end, and configured to be controlled by the potential level at the $i^{th}$ pull-down node to pull-down the potential level of the pull-up node and the potential level of the output end to a low voltage level.

18. A method for driving a shift register unit, comprising:
receiving, by an input circuit, a first input with a high first input level of the first input from a first input end of the input circuit;
receiving, by the input circuit, a first power signal with a high first power signal level of the first power signal from a first power signal end of the input circuit;
driving a pull-up level to a high pull-up level at a pull-up node, wherein the pull-up node is connected to the input circuit and a pull-up circuit and is between the input circuit and the pull-up circuit;
receiving, by the pull-up circuit, a clock signal with a low clock signal of the clock signal from a clock signal end of the pull-up circuit;
outputting, by the pull-up circuit, an output signal with a low output signal level of the output signal from an output end of the pull-up circuit;
driving a second pull-down level to a low second pull-down level at a second pull-down node of a second pull-down circuit and receiving a second control signal with a high second control signal level of the second control signal from a second control signal end of the second pull-down circuit; and obtaining a first pull-down level to a low first pull-down level at a first pull-down node of a first pull-down circuit and receiving a first control signal with a low first control signal level of the first control signal from a first control signal end of the first pull-down circuit, wherein both the first pull-down circuit and the second pull-down circuit are connected to the pull-up node and the output end.

19. The method of claim 18, further comprising:

receiving, by the input circuit, a second input with a low second input level of the second input from a second input end of the input circuit;

switching the first input to a lower first input level of the first input;

switching the clock signal to a high clock signal level of the clock signal;

boosting up the pull-up level to a higher pull-up level of the pull-up level;

changing the output signal to a high output signal level of the output signal;

changing the first control signal to a high first control signal level of the first control signal and maintain the first pull-down level to the low first pull-down level at the first pull-down node; and changing the second control signal to a low control signal level of the second control signal, and maintaining the second pull-down level at the low second pull-down level at the second pull-down node.

20. The method of claim 19, further comprising:

switching the second input to a high second input level of the second input;

receiving, by the input circuit, a second power signal with a low second power signal level of the second power signal from a second power signal end of the input circuit;

switching the pull-up level to a low pull-up level of the pull-up level;

maintaining the first control signal to the high first control signal level and driving the first pull-down level to a high first pull-down level of the first pull-down level;

driving down the output signal to the low output signal level;

switching the second input to the low second input level and maintaining the first input to the low first input level;

changing the second control signal to the high second control signal level, and changing the first control signal to the low first control signal level;

driving up the second pull-down level to the high second pull-down level;

maintaining the output signal to the low output signal level;

switching the first control signal to the high first control signal level;

driving the first pull-down level to the high first pull-down level; and maintaining the output signal to the low output signal level.

* * * * *